(12) United States Patent
Bohannon

(10) Patent No.: US 11,606,524 B2
(45) Date of Patent: Mar. 14, 2023

(54) CTIA CMOS IMAGE SENSOR PIXEL WITH ZERO-BIASED MULTIPLEXER

(71) Applicant: Sony Group Corporation, Tokyo (JP)

(72) Inventor: Eric Bohannon, Henrietta, NY (US)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 17/245,758

(22) Filed: Apr. 30, 2021

(65) Prior Publication Data

US 2022/0353454 A1  Nov. 3, 2022

(51) Int. Cl.
*H04N 5/3745* (2011.01)
*H04N 5/363* (2011.01)
*H04N 5/355* (2011.01)
*H01L 27/146* (2006.01)

(52) U.S. Cl.
CPC ... *H04N 5/37457* (2013.01); *H01L 27/14612* (2013.01); *H04N 5/3559* (2013.01); *H04N 5/363* (2013.01)

(58) Field of Classification Search
CPC .. H04N 5/37457; H04N 5/3559; H04N 5/363; H01L 27/14612
See application file for complete search history.

(56) References Cited

U.S. PATENT DOCUMENTS

| | | | | |
|---|---|---|---|---|
| 5,543,838 A | * | 8/1996 | Hosier | H04N 3/1593 348/304 |
| 2005/0218299 A1 | * | 10/2005 | Olsen | H04N 5/378 348/E3.029 |
| 2011/0068860 A1 | * | 3/2011 | Baud | G01J 1/46 330/7 |
| 2012/0105695 A1 | * | 5/2012 | Iida | H04N 5/363 348/301 |
| 2015/0256765 A1 | * | 9/2015 | Shafer | H04N 5/32 250/370.08 |

* cited by examiner

*Primary Examiner* — Padma Haliyur
(74) *Attorney, Agent, or Firm* — Michael Best & Friedrich LLP

(57) ABSTRACT

An image sensor and pixel circuit therefor includes a plurality of photoelectric conversion devices, a zero-biased multiplexer connected to the plurality of photoelectric conversion devices, an amplifier including a first input terminal connected to the zero-biased multiplexer, and an output terminal, a capacitor disposed between the first input terminal and the output terminal, and a reset switch disposed between the first input terminal and the output terminal in parallel with the capacitor, the reset switch including a body terminal connected to a common reference voltage.

16 Claims, 5 Drawing Sheets

CTIA CMOS IMAGE SENSOR PIXEL WITH ZERO-BIASED MULTIPLEXER

BACKGROUND OF THE INVENTION

1. Field of the Invention

This application relates generally to image sensors. More specifically, this application relates to pixel circuits for implementing a capacitive transimpedance amplifier (CTIA) pixel circuit architecture in high conversion gain and small-pixel applications.

2. Description of Related Art

Image sensing devices typically consist of an image sensor, generally implemented as an array of pixel circuits, as well as signal processing circuitry and any associated control or timing circuitry. Within the image sensor itself, charge is collected in a photoelectric conversion device of the pixel circuit as a result of the impingement of light.

Some existing pixel circuits implement a complementary metal-oxide-semiconductor (CMOS) architecture, in which the transfer of the charge within the pixel circuit and/or to downstream circuitry (e.g., signal processing circuitry) is controlled using one or more metal-oxide-semiconductor field-effect transistors (MOSFETs). A CTIA pixel circuit is one example of a pixel circuit which implements the CMOS architecture.

Some comparative CTIA pixel circuits may exhibit leakage current. Therefore, there exists a need for a CTIA pixel circuit that minimizes potential leakage currents to achieve a linear zero-biased high conversion gain and minimizes area when using a matrix of these circuits together.

BRIEF SUMMARY OF THE INVENTION

Various aspects of the present disclosure relate to an image sensor and different pixel circuits with a zero-biased multiplexer.

In one aspect of the present disclosure, there is provided a pixel circuit comprising a plurality of photoelectric conversion devices, a zero-biased multiplexer, an amplifier, a capacitor, and a reset switch. The zero-biased multiplexer is connected to the plurality of photoelectric conversion devices. The amplifier includes a first input terminal connected to the zero-biased multiplexer, and an output terminal. The capacitor is disposed between the first input terminal and the output terminal. The reset switch is disposed between the first input terminal and the output terminal in parallel with the capacitor, the reset switch including a body terminal connected to a common reference voltage.

In another aspect of the present disclosure, there is provided a pixel circuit comprising a zero-biased multiplexer, an amplifier, a capacitor, a reset switch network, and a plurality of pixels arranged in an array. The amplifier includes a first input terminal connected to the zero-biased multiplexer, and an output terminal. The capacitor is disposed between the first input terminal and the output terminal. The reset switch network is disposed between the first input terminal and the output terminal in parallel with the capacitor, the reset switch network including a first reset transistor with a first body terminal connected to a common reference voltage, a second reset transistor, and a third reset transistor. The plurality of pixels arranged in an array, a first pixel of the plurality of pixels including a first photoelectric conversion device that is connected to the zero-biased multiplexer, and a second pixel of the plurality of pixels including a second photoelectric conversion device that is connected to the zero-biased multiplexer.

In this manner, the above aspects of the present disclosure provide for improvements in at least the technical field of imaging, as well as the related technical fields of signal processing, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the processing circuits are used in image sensors, it will be understood that this is merely one example of an implementation. It will further be understood that the disclosed systems and methods can be used in any device in which there is a need to reduce noise in a signal processing or other analog circuit; for example, an audio signal processing circuit, industrial measurement and systems, and the like. Furthermore, the image sensor implementations described below may be incorporated into an electronic apparatus, including but not limited to a smartphone, a tablet computer, a laptop computer, and the like.

Image Sensor

Figure 1:
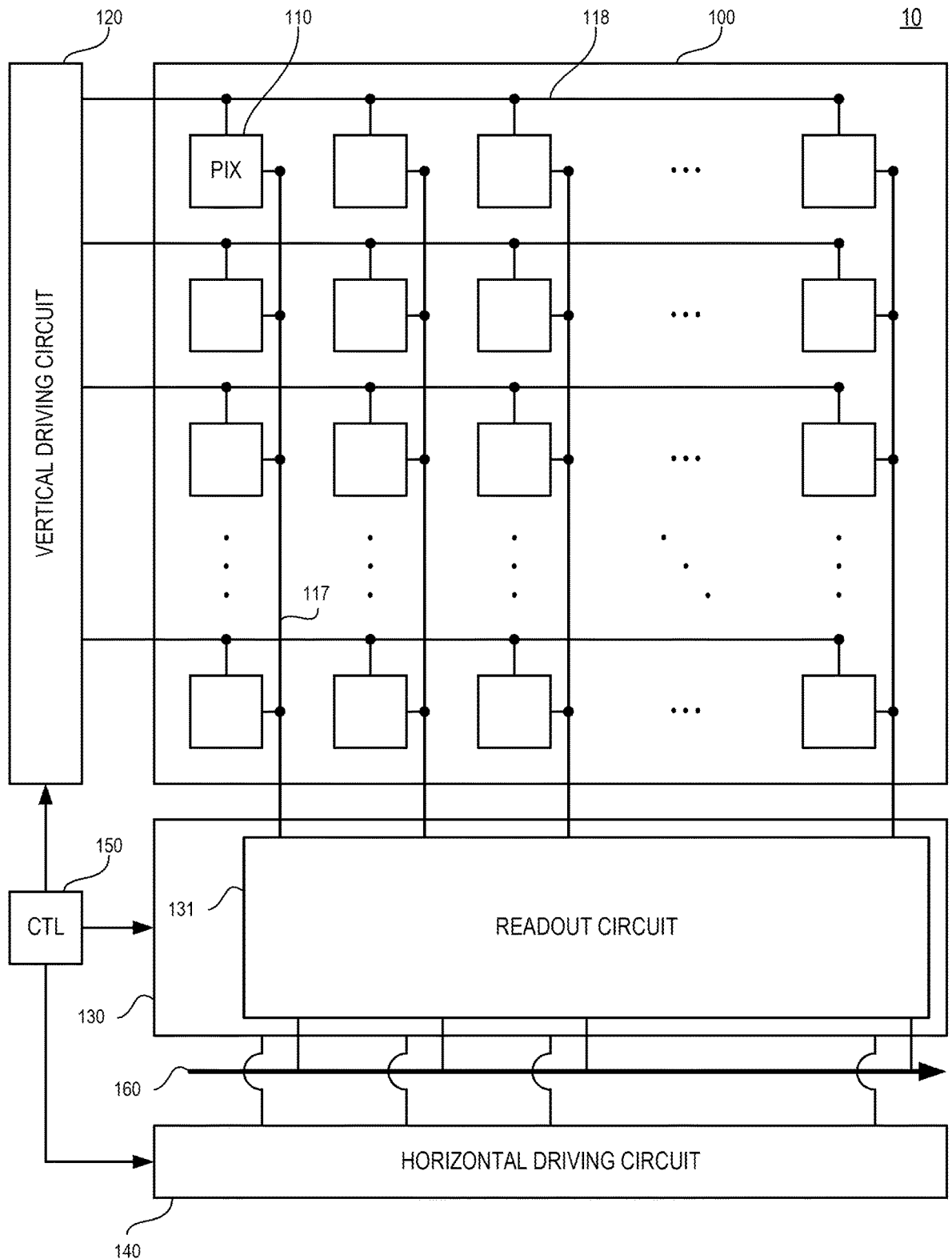
FIG. 1 is a diagram illustrating an exemplary image sensor, in accordance with various aspects of the present disclosure.

FIG. 1 illustrates an image sensor 10 according to various aspects of the present disclosure. The image sensor 10 includes an array 100 of pixel circuits 110. The pixel circuits 110 are located at intersections where horizontal signal lines 118 and vertical signal lines 117 cross one another. The horizontal signal lines 118 are operatively connected to a vertical driving circuit 120, also known as a "row scanning circuit," at a point outside of the pixel array 100, and carry signals from the vertical driving circuit 120 to a particular row of the pixel circuits 110. Pixels in a particular column output an analog signal corresponding to an amount of incident light to the vertical signal line 117 for that column. For illustration purposes, only a subset of the pixel circuits 110 are actually shown in FIG. 1; however, in practice the image sensor 10 may have up to tens of millions of pixel circuits ("megapixels" or MP) or more.

Each vertical signal line 117 conducts the analog signal for a particular column to a column circuit 130, also known as a "signal processing circuit." While FIG. 1 illustrates one vertical signal line 117 for each column in the pixel array 100, the present disclosure is not so limited. For example, more than one vertical signal line 117 may be provided for each column, or each vertical signal line 117 may correspond to more than one column. In any case, the column circuit 130 preferably includes a readout circuit 131, which may include a plurality of individual sub-circuits and is also known collectively as "readout and ADC circuits". The column circuit 130 including the readout circuit 131 may include various components such as one or more analog amplifiers, ADCs, S/H circuits, and the like. The various components of the column circuit 130 may communicate with one another via a bus line 160. The column circuit 130 is configured to perform one or more signal processing operations on a signal received via the vertical signal line 117, including but not limited to an amplifying operation, an analog-to-digital conversion operation, a sampling operation, a correlated double sampling (CDS) operation, a pixel binning operation, a pixel thinning operation, an output operation, and the like.

The column circuit 130 is operatively connected to a horizontal driving circuit 140, also known as a "column scanning circuit." A controller 150 is in electric communication with the vertical driving circuit 120, the horizontal driving circuit 140, and the column circuit 130. Signals from the controller 150 may be transmitted to a specific pixel circuit 110 within the array 100 by selecting a particular row via a horizontal signal line 118 and a particular column via a vertical signal line 117.

CTIA Pixel Circuits

Figure 2:
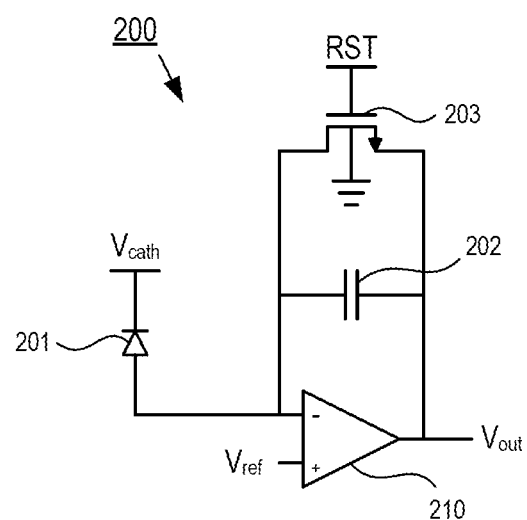
FIG. 2 is a circuit diagram illustrating an exemplary pixel circuit, in accordance with various aspects of the present disclosure.

FIG. 2 illustrates an exemplary pixel circuit 200 in accordance with the present disclosure, which implements a CTIA architecture. Specifically, FIG. 2 illustrates the pixel circuit 200 as a differential amplifier implementation. The pixel circuit 200 is one example of the pixel circuit 110 illustrated in FIG. 1.

The pixel circuit 200 includes a photoelectric conversion device 201 (e.g., a photodiode), a feedback capacitor 202, a reset transistor 203, and a differential amplifier 210. In this implementation, the reset transistor 203 is connected in parallel with the electrodes of the feedback capacitor 202, and a body terminal of the reset transistor 203 is grounded. In other examples not illustrated, the body terminal of the reset transistor 203 may be connected to a source terminal of the reset transistor 203, thereby creating a source-body tie, or the body terminal of the reset transistor 203 may be connected to a common voltage $V_{ref}$, thereby creating a shared-body connection between a plurality of reset transistors 203 implemented in the array 100 of pixel circuits 110. In the example of FIG. 2, the common voltage $V_{ref}$ may be 1.4 volts (V) with the differential amplifier 210. However, the common voltage $V_{ref}$ may be a different voltage when a different amplifier type is used in place of the differential amplifier 210.

The pixel circuit 200 integrates a charge on the photoelectric conversion device 201, and outputs a signal $V_{out}$ indicative of the charge. An inverting terminal of the differential amplifier 210 is operatively connected to an anode electrode of the photoelectric conversion device 201, and a non-inverting terminal of the differential amplifier 210 receives a reference voltage $V_{ref}$. The signal $V_{out}$ may be output to the appropriate vertical signal line 117 illustrated in FIG. 1. While not illustrated in the particular example of FIG. 2, the pixel circuit 200 may include one or more additional transistors, such as a selection transistor between the output of the pixel circuit 200 and the vertical signal line 117. Moreover, while FIG. 2 illustrate n-type MOS (NMOS) transistors, the pixel circuit 200 may be implemented using p-type MOS (PMOS) transistors or using a combination of NMOS and PMOS transistors.

The reset switch discussed above is implemented as the signal reset transistor 203 in FIG. 2. A gate terminal of the reset transistor 203 receives a reset signal RST. In some aspects, the reset signal RST is a reset voltage $V_{reset}$ that, when applied to the gate of the reset transistor 203, turns on the reset transistor 203 to conduct current flow. Depending on the value of the control signal RST at a given time, the reset transistor 203 is either in an open state such that no current is conducted or a closed state such that current flow is conducted. In practice, however, the reset transistor 203 conducts leakage current from a source terminal thereof to a drain terminal thereof, even when the control signal RST is such that the reset transistor 203 is in the open state. This source-to-drain leakage current may be integrated onto the feedback capacitor 202 and consume dynamic range, potentially resulting in INL degradation due to a nonlinear function of voltage across the reset transistor 203. In addition, the leakage current, when integrated onto the feedback capacitor 202, may flow through the feedback capacitor 202 and into the drain-to-body junction on the reset transistor 203. This drain-to-body current flow exists because the junction may not be zero-biased.

A CTIA pixel circuit may implement a capacitor and a reset switch which resets the pixel circuit (e.g., by reinitializing the charge on the capacitor) between integrations. An ideal reset switch would present infinite impedance when open, and thus would not conduct any current. However, practical circuit components may conduct leakage current even when the switch is open. This leakage current may be problematic in operating the pixel circuit. In particular, the leakage current may be integrated onto the capacitor and consume dynamic range and/or result in integral non-linearity (INL) degradation.

These effects may lead to low gain in the pixel circuit. Thus, it may be difficult to build a high conversion-gain CTIA pixel circuit. For example, a larger conversion gain may be realized by using a capacitor having a relatively small capacitance. However, if the capacitance is too small, the effects of the leakage current may become large. These problems may also be exacerbated as integration time increases.

Additionally, the pixel circuit 200 implements the photodiode 201 with one feedback capacitor 202, one reset transistor 203, and one differential amplifier 210. In other words, the implementation of the pixel circuit 200 in the array 100 would result in each pixel 110 requiring an individual feedback capacitor 202, an individual reset transistor 203, and an individual differential amplifier 210, which significantly increases the circuit area of each pixel 110.

To address the effects of leakage current through the reset switch and the large circuit area required by the pixel circuit 200, an implementation using a zero-biased multiplexer will be described in more detail below.

Zero-Biased Multiplexer

Figure 3:
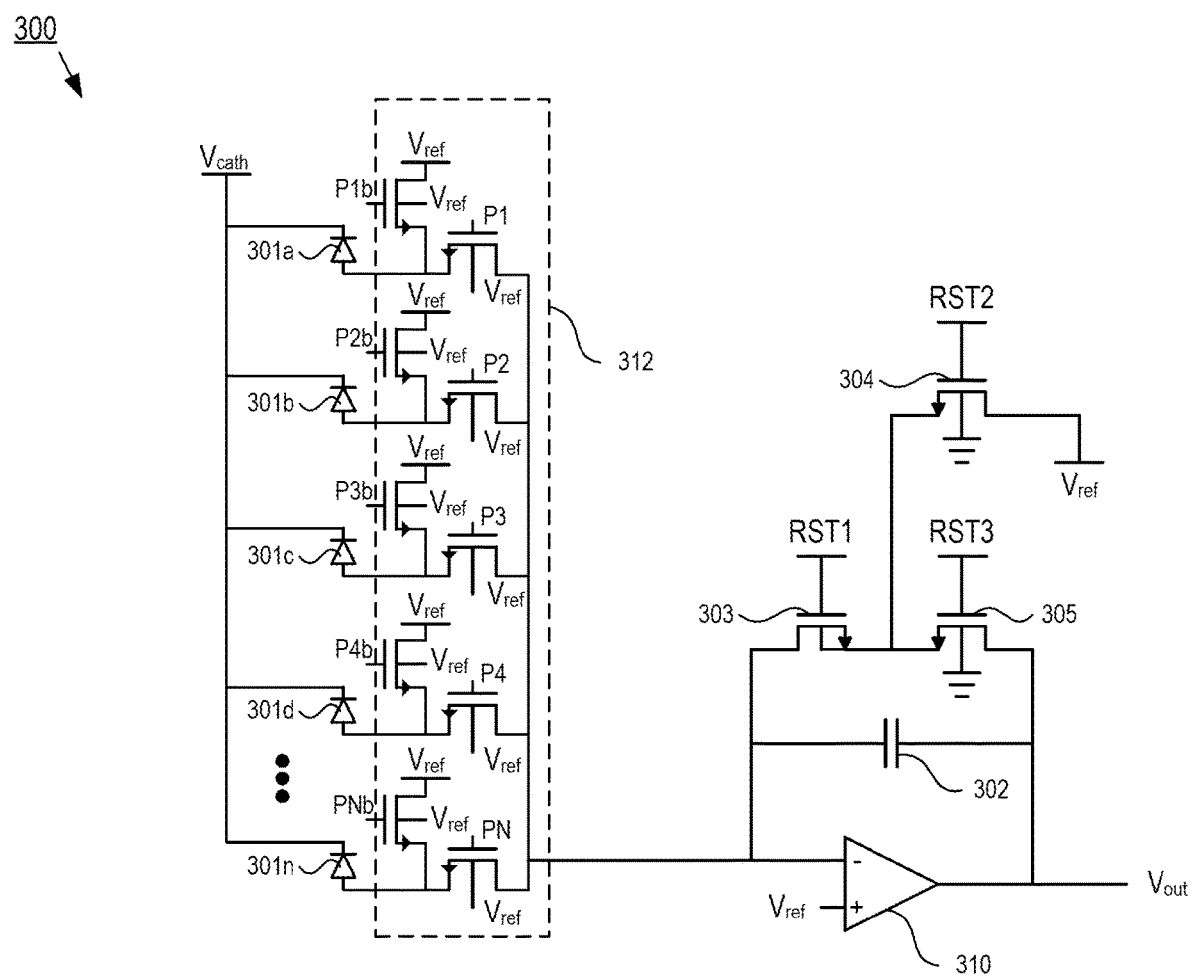
FIG. 3 is a circuit diagram illustrating an exemplary pixel circuit that implements a zero-biased multiplexer, in accordance with various aspects of the present disclosure.

FIG. 3 is a circuit diagram illustrating an exemplary pixel circuit 300 that implements a zero-biased multiplexer, in accordance with various aspects of the present disclosure. The pixel circuit 300 is one example of the pixel circuit 110 illustrated in FIG. 1.

Compared with the pixel circuit 200 illustrated in FIG. 2, the pixel circuit 300 replaces the single reset transistor 203 with a three-transistor reset switch network. In particular, the pixel circuit 300 includes a plurality of photoelectric conversion devices 301a-301n (e.g., photodiodes), a feedback capacitor 302, a first reset transistor 303, a second reset transistor 304, a third reset transistor 305, a differential amplifier 310, and a zero-biased multiplexer (MUX) 312.

The pixel circuit 300 integrates a charge on the photoelectric conversion device 301 and outputs a signal $V_{out}$ indicative of the charge. An inverting terminal of the differential amplifier 310 is operatively connected to an output of the zero-biased multiplexer 312, and a non-inverting terminal of the differential amplifier 310 receives a reference voltage $V_{ref}$. The signal $V_{out}$ may be output to the appropriate vertical signal line 117 illustrated in FIG. 1. While not illustrated in the particular example of FIG. 3, the pixel circuit 300 may include one or more additional transistors, such as a selection transistor or a source follower transistor between the output of the pixel circuit 300 and the vertical signal line 117. Moreover, while FIG. 3 illustrates NMOS transistors, the pixel circuit 300 may be implemented using PMOS transistors or using a combination of NMOS and PMOS transistors.

In the reset switch network, a body terminal of the first reset transistor 303 is connected to a source terminal of the first reset transistor 303, thereby creating a source-body tie. This source-body tie in the first reset transistor 303 creates a unique well voltage in each pixel circuit 110 that implements the reset switch network and thus consumes a larger pixel area. The respective body terminals of the second reset transistor 304 and the third reset transistor 305 are grounded. The first reset transistor 303 and the third reset transistor 305 are connected in series across the electrodes of the feedback capacitor 302, such that the source terminal of the first reset transistor 303 is connected to a source terminal of the third reset transistor 305. However, in other examples, the source terminal of the first reset transistor 303 may be connected to a drain terminal of the third reset transistor 305 or vice versa.

A source terminal of the second reset transistor 304 is connected to a node between the first reset transistor 303 and the third reset transistor 305. A drain terminal of the second reset transistor 304 is connected to the reference voltage $V_{ref}$. However, in other examples, the second reset transistor 304 and the third reset transistor 305 may be source-body tied to the same body connection as the first reset transistor 303.

Each of the transistors in the reset switch network operates under the control of a corresponding control signal, such that a gate terminal of the first reset transistor 303 receives a first reset signal RST1, a gate terminal of the second reset transistor 304 receives a second reset signal RST2, and a gate terminal of the third reset transistor 305 receives a third reset signal RST3.

In operation, the pixel circuit 300 has two main operating states: a reset state and an integration state. During the integration state of the pixel circuit 300, the reset signals RST1-RST3 have respective values such that the first reset transistor 303 is in the open state, the second reset transistor 304 is in the closed state, and the third reset transistor 305 is in the open state. In this state, the leakage current is minimized because, ignoring the offset voltage of the differential amplifier 310, the respective voltages on all terminals of the second reset transistor 304 are equal. The junction component of the leakage current is minimized because the first reset transistor 303 is source-body tied and the source and body are driven to $V_{ref}$ when the second reset transistor 304 is closed.

During the reset state of the pixel circuit 300, the reset signals RST1-RST3 have respective values such that the first reset transistor 303 is in the closed state, the second reset transistor 304 is in the open state, and the third reset transistor 305 is in the closed state. This effectively places the circuit in a unity-gain mode, such that the reference voltage $V_{ref}$ is passed to the output $V_{out}$ (ignoring offset voltage). In order to account for systematic offset in the differential amplifier 310, it may instead be possible to pass a voltage other than the reference voltage $V_{ref}$ in this state. Moreover, in some implementations, when transitioning from the reset state to the integration state, the first reset transistor 303 may be opened before the second reset transistor 304 closes and the third reset transistor 305 opens. This timing may minimize charge injection.

A larger conversion gain (e.g., greater than 50 μV/e⁻) may be realized by implementing the network of reset switches to replace the single reset switch. Increasing the number of reset switches in the CTIA pixel circuit may, under certain circuit designs, minimize the leakage current. However, although the junction component of the leakage current is minimized in the pixel circuit 300, the reset switch network of pixel circuit 300 still creates a unique well voltage. When a plurality of the pixel circuits 300 are combined to create the array 100 of pixel circuits 110 as shown in FIG. 1, the unique well voltage of each pixel circuit 300 consumes dynamic range, thus making it more difficult to implement high conversion gain pixels.

Therefore, a CTIA pixel circuit utilizing the zero-biased multiplexer 312 may be implemented to minimize leakage current and reduce the per-pixel area, as described in further detail below.

As illustrated in FIG. 3, in the zero-biased multiplexer 312, each photodiode is connected to a pair of switches (e.g., the photodiode 301a is connected to a first switch P1 and a second switch P1b, the photodiode 301b is connected to a first switch P2 and a second switch P2b, etc.). Assuming a fixed temperature, the charge injection of these pair of switches in the zero-biased multiplexer 312 is substantially the same every time and there is no linearity (INL) degradation because voltage across the switch terminals does not change. The charge injection is, to a first-order, the same every time because the switches have the same voltage ($V_{REF}$) across their sources and drains when the switches opened.

Each first switch PX (X=1 through N as illustrated in FIG. 3) is connected between the virtual ground of the differential amplifier 310 and the anode of its corresponding photodiode. For example, the first switch P1 is connected between the virtual ground of the differential amplifier 310 and the anode of the photodiode 301a. When a given first switch PX is closed, the corresponding photodiode is connected to the virtual ground of the differential amplifier 310 and the corresponding photodiode may perform integration. In other words, the zero-biased multiplexer 312 connects multiple photodiodes to one floating diffusion with respective transfer gates (i.e., the first switches PX).

Additionally, the source and drain terminals of the first switch PX are substantially equal to the same voltage. Consequently, no source-to-drain current (i.e., no dark current), other than the photodiode current, flows into the CTIA. Furthermore, the body terminal of the first switch PX is connected to $V_{REF}$, which is roughly equal to the virtual ground voltage of the differential amplifier 310. Therefore, no drain-to-body or source-to-body PN junction current flows into the CTIA because these junctions are zero-biased.

Further, when one of the first switches PX is closed, the paired second switch PXb (X=1 through N as illustrated in FIG. 3) is open while the paired first switch PX is closed. All other second switches PX are closed while the paired first switch PX is closed. For example, when the first switch P1 is closed, the paired second switch P1b is open and the second switches P2-PN are closed while the first switch P1 is closed. The body terminal of the second switch PXb is connected to $V_{REF}$, which is roughly equal to the virtual ground voltage of the differential amplifier 310. Therefore, the source-to-body diode is zero-biased. Consequently, no PN junction current flows into the CTIA.

After the first switch PX opens, the paired second switch PXb closes, and the photodiode is disconnected from the CTIA. The drain-to-body PN junction of the first switch PX is zero-biased ($V_{REF}$ is roughly on both terminals). Consequently, no PN junction current flows into the CTIA. The drain, source, and body terminals of the second switch PXb and the cathode of the photodiode are all roughly equal to the voltage $V_{REF}$. Consequently, the disconnected photodiode remains zero-biased, which helps to reduce or prevent crosstalk between photodiodes.

Additionally, there is a noise gain reduction when a given first switch PX opens. The noise gain is proportional to 1+CB/CFB, where CB is the photodiode background capacitance and CFB is the CTIA feedback capacitance. The noise gain decreases (ideally to 1) when the first switch PX opens because the photodiode background capacitance (CB) is no longer connected to the input of the CTIA. This noise reduction is significant when the photodiode background capacitance (CB) is significantly larger than the CTIA feedback capacitance. In some examples, although the first switch PX may be opened in the reset period as described below, the first switch PX may preferably be opened at the end of the integration period and before the reset period is entered.

Figure 4:
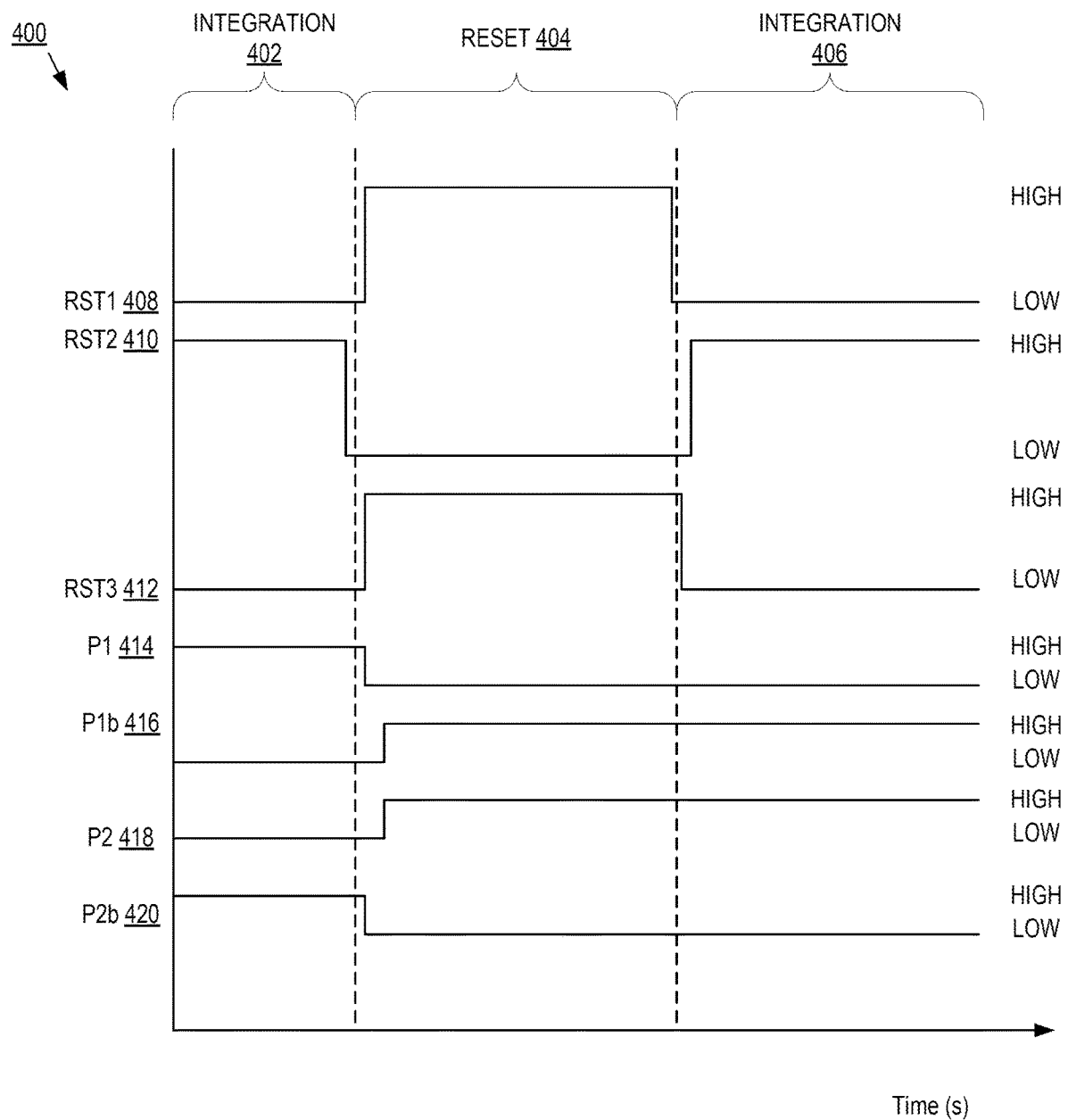
FIG. 4 is a timing diagram illustrating one example of timings with respect to the exemplary pixel circuit of FIG. 3, in accordance with various aspects of the present disclosure.

FIG. 4 is a timing diagram illustrating one example of timings 400 with respect to the exemplary pixel circuit 300 of FIG. 3, in accordance with various aspects of the present disclosure. As illustrated in FIG. 4, the timings 400 are during an integration period 402, a reset period 404, and an integration period 406. The timings 400 include a first reset transistor RST1 timing 408, a second reset transistor RST2 timing 410, a third reset transistor RST3 timing 412, a first switch P1 timing 414, a second switch P1b timing 416, a first switch P2 timing 418, and a second switch P2b timing 420.

The first reset transistor RST1 timing 408 is a timing of a first reset control signal with respect to the first reset transistor 303 of FIG. 3. The first reset transistor 303 is in an open state when the first reset transistor RST1 timing 408 is low and the first reset transistor 303 is in a closed state when the first reset transistor RST1 timing 408 is high.

The second reset transistor RST2 timing 410 is a timing of a second reset control signal with respect to the second reset transistor 304 of FIG. 3. The second reset transistor 304 is in an open state when the second reset transistor RST2 timing 410 is low and the second reset transistor 304 is in a closed state when the second reset transistor RST2 timing 410 is high.

The third reset transistor RST3 timing 412 is a timing of a third reset control signal with respect to the third reset transistor 305 of FIG. 3. The third reset transistor 305 is in an open state when the third reset transistor RST3 timing 412 is low and the third reset transistor 305 is in a closed state when the third reset transistor RST3 timing 412 is high.

The first switch P1 timing 414 is a timing of a first control signal with respect to the first switch P1 of FIG. 3. The first switch P1 is in an open state when the first switch P1 timing 414 is low and the first switch P1 is in a closed state when the first switch P1 timing 414 is high.

The second switch P1b timing 416 is a timing of a second control signal with respect to the second switch P1b of FIG. 3. The second switch P1b is in an open state when the second switch P1b timing 416 is low and the second switch P1b is in a closed state when the second switch P1b timing 416 is high.

The first switch P2 timing 418 is a timing of a first control signal with respect to the first switch P2 of FIG. 3. The first switch P2 is in an open state when the first switch P2 timing 418 is low and the first switch P2 is in a closed state when the first switch P2 timing 418 is high.

The second switch P2b timing 420 is a timing of a second control signal with respect to the second switch P2b of FIG. 3. The second switch P2b is in an open state when the second switch P2b timing 420 is low and the second switch P2b is in a closed state when the second switch P2b timing 420 is high.

During the integration period 402, the CTIA is integrating the first photodiode 301a. As illustrated in FIG. 4, during the integration period 402, the first reset transistor RST1 timing 408 is initially low, the second reset transistor RST2 timing 410 is initially high, the third reset transistor RST3 timing 412 is initially low, the first switch P1 timing 414 is initially high, the second switch P1b timing 416 is initially low, the first switch P2 timing 418 is initially low, and the second switch P2b timing 420 is initially high. In other words, the first reset transistor 303, the third reset transistor 305, the second switch P1b, the first switch P2 are in an open state and the second reset transistor 304, the first switch P1, the second switch P2b are in a closed state.

As the integration period 402 begins to transition to the reset period 404, the second reset transistor RST2 timing 410 goes low and changes from closed state to an open state. Once the second reset transistor RST2 timing 410 is low, during the reset period 404, then the first reset transistor RST1 timing 408 and the third reset transistor RST3 timing 412 go high and change from an open state to a closed state (at the same time, in some examples). As the second reset transistor RST2 timing 410 goes low, the second reset transistor RST2 304 no longer drives $V_{REF}$ into the first reset transistor RST1 303. Additionally, as the first reset transistor RST1 timing 408 and the third reset transistor RST3 timing 412 go high, the first reset transistor RST1 303 and the third reset transistor RST3 305 close and force the CTIA into unity gain.

Additionally, during the reset period 404, the first switch P1, the second switch P1b, the first switch P2, and the second switch P2b change their respective timings, which transitions the zero-biased multiplexer 312 for the next integration. As illustrated in FIG. 4, when the CTIA goes into the reset period 404, timings associated with the first switch P1 and the second switch P2b go low and the first switch P1 and the second switch P2b open (at the same time, in some examples). The first switch P1 in an open state disconnects the first photodiode 301a from the differential amplifier 310 during the integration period 406. Further, the opening of the P1 and P2b switches is done during the reset period 404 to eliminate the impact of charge injection and charge feedthrough.

Then, a short time later and as illustrated in FIG. 4, timings associated with the second switch P1b and the first switch P2 go high and the second switch P1b and the first switch P2 close (at the same time, in some examples). The first switch P2 in a closed state connects the second photodiode 301b to the differential amplifier 310 for integration during the integration period 406. Additionally, the closing of the P2 and P1b switches is done during the reset period 404 to eliminate the impact of charge injection and charge feedthrough.

As illustrated in FIG. 4, states of the first reset transistor RST1 timing 408, the second reset transistor RST2 timing 410, and the third reset transistor timing 412 are changed when transitioning from the reset period 404 to the integration period 406. Specifically, as the reset period 404 begins to transition to the integration period 406, during the reset period 404, the first reset transistor RST1 timing 408 and the third reset transistor RST3 timing 412 go low and change from a closed state to an open state (at the same time, in some examples). Once the first reset transistor RST1 timing 408 and the third reset transistor RST3 timing 412 are low, during the integration period 406, the second reset transistor RST2 timing 410 goes high and changes from an open state to a closed state. As the second reset transistor RST2 timing 410 goes high, the second reset transistor RST2 304 drives $V_{REF}$ into the first reset transistor RST1 303. Additionally, as the first reset transistor RST1 timing 408 and the third reset transistor RST3 timing 412 go low, the first reset transistor RST1 303 and the third reset transistor RST3 305 open and no longer force the CTIA into unity gain. The CTIA, during the integration period 406, then integrates the second photodiode 301b.

While the timings 400 of FIG. 4 are described with respect to the first photodiode 301a and the second photodiode 301b, the timings 400 of FIG. 4 are similar to other timings with respect to the third photodiode 301c through the n-th photodiode 301n. Although not illustrated in FIG. 4, the third photodiode 301c through the n-th photodiode 301n would each integrate during respective integration periods with reset periods occurring before and after the respective integration periods. Moreover, once the n-th photodiode 301n has been integrated and a reset period has occurred after the integration period of the n-th photodiode 301n, the timings 400 repeat and the photodiodes 301a-301n continue to iteratively integrate. Lastly, although not illustrated in FIG. 4, the analog-to-digital (ADC) conversion would also occur at the end of each integration period.

Referring back to FIG. 3, different designs of reset switch networks may be implemented across various pixels in the pixel circuit. For example, other pixels in the array 100 may implement the single reset switch as shown in FIG. 2 instead of the three reset switch network illustrated in FIG. 3. In such an implementation, the body terminal of the single reset transistor among several pixels may be connected to a common reference voltage $V_{ref}$. The pixel circuit may also implement a combination of single reset switches, three-transistor reset switch networks, and/or other reset switch designs.

Additionally, different designs of the zero-biased multiplexer and the CTIA may be implemented in the image sensor 10. For example, some or all of the zero-biased multiplexer and/or the CTIA may be located external to the pixel 110 in the image sensor 10. Additionally or alternatively, in some examples, a zero-biased multiplexer may be shared among one or more pixels of the plurality of pixels. Specifically, a first pixel of a plurality of pixels arranged in an array may include a first photoelectric conversion device that is connected to a first zero-biased multiplexer, and a second pixel of the plurality of pixels may include a second photoelectric conversion device that is connected to the first zero-biased multiplexer that is also connected to the first photoelectric conversion device of the first pixel. This shared zero-biased multiplexer may be implemented as part of a binning strategy.

The zero-biased multiplexer 312 also provides several advantages because the zero-biased multiplexer 312 connects multiple photodiodes to one floating diffusion with respective transfers gates. A first advantage is the zero-biased multiplexer 312 keeping the photodiodes 301a-301n in a zero bias state at all times. A second advantage is the zero-biased multiplexer 312 providing a unique well because the zero-biased multiplexer 312 is not tied to ground. The body terminals of the first switch PX, the second switch PXb, and the first reset transistor RST1 may be transistors in common with each other such that these transistors may sit in a unique well. This also reduces area compared to having a unique well per transistor. Moreover, the zero-biased multiplexer 312 may be used to combine a well across a row or a column in the pixel array.

A third advantage is the zero-biased multiplexer 312 allowing the photodiodes to be spaced at a smaller pitch, the photodiodes to be is less noisy, and the photodiodes to have a larger dynamic range than directly connecting the photodiodes directly to the CTIA. This third advantage is further enhanced when the photodiodes are on a different substrate than the CTIA (e.g., when the photodiodes are on a quantum film).

A fourth advantage is that the zero-biased multiplexer 312 allows multiple distinct multiplexer switches PX to be closed at the same time, which allows for binning or global shutter with respect to one photodiode with a column readout after global sensing and global reset. For example, if all pixels on an image sensor have a multiplexer between the photodiode and the input of the CTIA, then global shutter may be implemented on the image sensor. Specifically, all PX switches may opened (at the same time, in some examples) at the end of integration and the CTIA output voltage will be held on the CTIA's feedback capacitor, CFB. In this example, all pixels may then be converted using column analog front-ends (AFEs).

Figure 5:
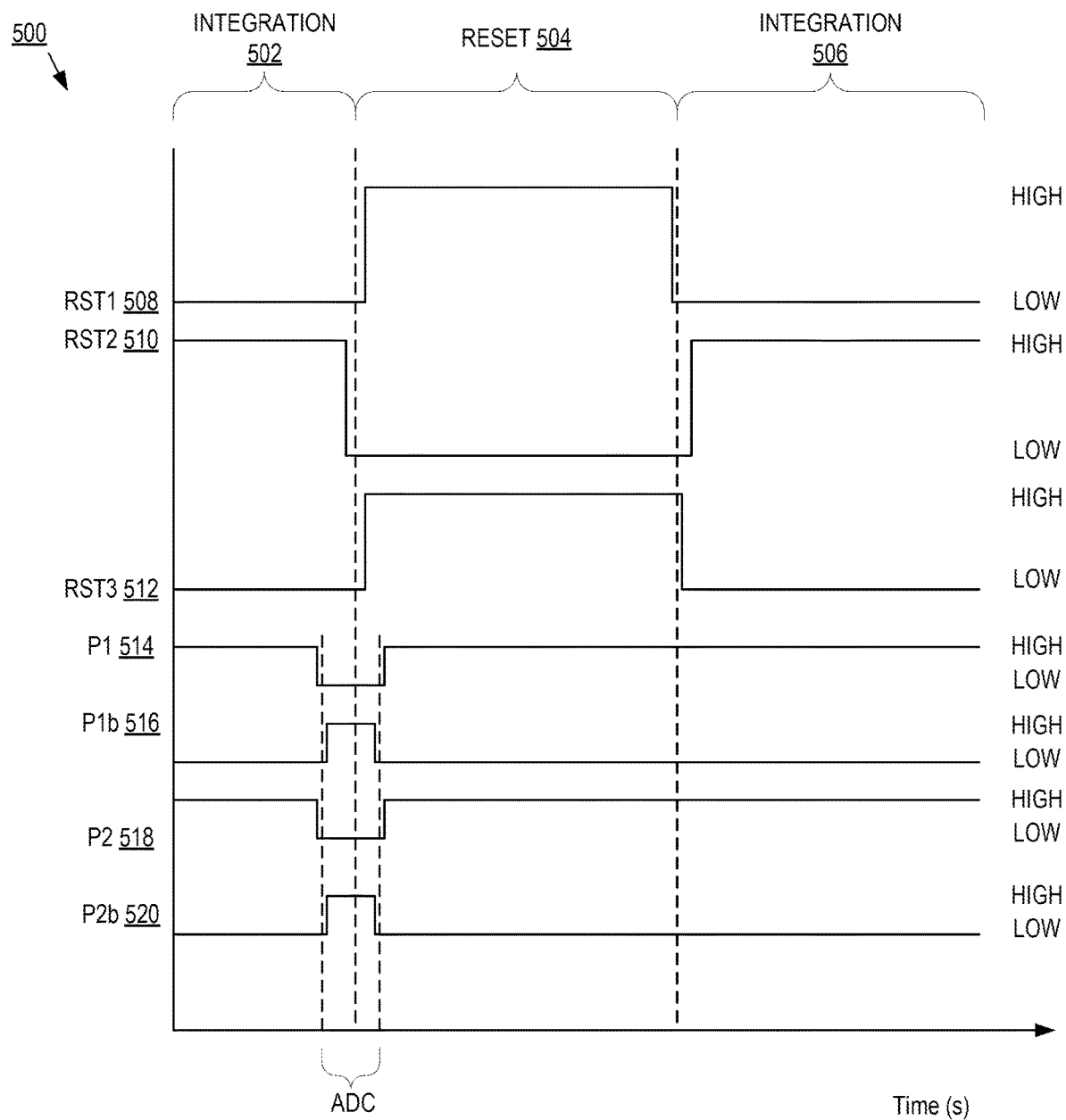
FIG. 5 is a timing diagram that illustrates one example of global shutter timings of two photodiodes, in accordance with various aspects of the present disclosure.

Assuming there is one CTIA and one switch network (PX, PXb) per photodiode, then FIG. 5 is a timing diagram that illustrates one example of global shutter timings 500 of two photodiodes (e.g., photodiodes from two different pixels 110), in accordance with various aspects of the present disclosure.

As illustrated in FIG. 5, the global shutter timings 500 includes reset transistor timings 508-512 that are the same as the reset transistor timings 408-412 described in FIG. 4 and associated with the first reset transistor RST1 303, the second reset transistor RST2 304, and the third reset transistor RST3 305 of FIG. 3. Consequently, the description of these reset timings 508-512 is not repeated herein.

However, the global shutter timings 500 includes multiplexer timings 514-520 that are different from the multiplexer timings 414-420 because the multiplexer timings 514-520 are with respect to photodiodes of two different pixels 110 and not with respect to photodiodes of the same pixel 110.

As illustrated in FIG. 5, a first photodiode of first pixel 110 and a second pixel of a second pixel 110 are both integrating during the integration period 502. Near the end of the integration period 502, the first switch P1 of the first pixel 110 and the first switch P2 of the second pixel 110 are changed from a closed state to an open state, which disconnects the first photodiode and the second photodiode from the respective CTIAs. Just after disconnecting the first photodiode and the second photodiode from the respective CTIAs, the charge integrated at the CTIA is output to the analog-to-digital converter (ADC) with a selection (SEL) transistor (not shown). Additionally, while the charge integrated at the CTIA is output to the analog-to-digital converter (ADC) with the selection (SEL) transistor or a source follower transistor, the second switch P1b of the first pixel 110 and the second switch P2b of the second pixel 110 are changed from an open state to a closed state, which connects the first photodiode and the second photodiode to the voltage $V_{ref}$.

At the beginning of the reset period 504, after the charge integrated at the CTIA is output to the analog-to-digital converter (ADC) with the selection (SEL) transistor, the second switch P1b of the first pixel 110 and the second switch P2b of the second pixel 110 are changed from a closed state to an open state, which disconnects the first photodiode and the second photodiode from the voltage $V_{ref}$. After disconnecting the first photodiode and the second photodiode from the voltage $V_{ref}$, the first switch P1 of the first pixel 110 and the first switch P2 of the second pixel 110 are changed from an open state to a closed state, which re-connects the first photodiode and the second photodiode to the respective CTIAs.

However, the first photodiode of the first pixel 110 and the second photodiode of the second pixel 110 do not integrate during the reset period 504 because the first reset transistor RST1 303 and the third reset transistor RST3 305 are in a closed state during the reset period 504 and the second reset transistor RST2 304 is in an open state. When the first reset transistor RST1 303 and the third reset transistor RST3 305 change to an open state and the second reset transistor RST2 304 changes to a closed state, then the first photodiode of the first pixel 110 and the second photodiode of the second pixel 110 begin to integrate a charge at their respective CTIAs and repeats the above-described global shutter process.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A pixel circuit, comprising:
    a plurality of photoelectric conversion devices;
    a zero-biased multiplexer connected to the plurality of photoelectric conversion devices;
    an amplifier including a first input terminal connected to the zero-biased multiplexer, and an output terminal;
    a capacitor disposed between the first input terminal and the output terminal; and
    a reset switch disposed between the first input terminal and the output terminal in parallel with the capacitor, the reset switch including a body terminal connected to a common reference voltage,
    wherein the zero-biased multiplexer includes a pair of switches connected to each of the plurality of photoelectric conversion devices,
    wherein a first switch of the pair of switches includes a first electrode connected to the first input terminal and a second electrode connected to a first electrode of the each of the plurality of photoelectric conversion devices, and
    wherein a second electrode of the each of the plurality of photoelectric conversion devices is connected to a cathode voltage.

2. The pixel circuit according to claim 1, wherein each of the plurality of photoelectric conversion devices receives a charge from an incident light, and the zero-biased multiplexer is configured to output a signal indicative of the charge that is received at the each of the plurality of photoelectric conversion devices to the amplifier.

3. The pixel circuit according to claim 1, wherein the reset switch and the pair of switches connected to each of the plurality of photoelectric conversion devices are each a transistor.

4. The pixel circuit according to claim 1, wherein the amplifier includes a second input terminal configured to receive a predetermined terminal voltage.

5. The pixel circuit according to claim 4, wherein the predetermined terminal voltage is equal to the common reference voltage.

6. The pixel circuit according to claim 1, wherein the common reference voltage is ground.

7. A pixel circuit, comprising:
a zero-biased multiplexer;
an amplifier including a first input terminal connected to the zero-biased multiplexer, and an output terminal;
a capacitor disposed between the first input terminal and the output terminal;
a reset switch network disposed between the first input terminal and the output terminal in parallel with the capacitor, the reset switch network including a first reset transistor with a first body terminal connected to a common reference voltage, a second reset transistor, and a third reset transistor; and
a plurality of pixels arranged in an array, a first pixel of the plurality of pixels including a first photoelectric conversion device that is connected to the zero-biased multiplexer, and a second pixel of the plurality of pixels including a second photoelectric conversion device that is connected to the zero-biased multiplexer,
wherein the zero-biased multiplexer includes a first pair of switches connected to the first photoelectric conversion device and a second pair of switches connected to the second photoelectric conversion device,
wherein a first switch of the first pair of switches includes a first electrode connected to the first input terminal and a second electrode connected to a first electrode of the first photoelectric conversion device, wherein a first switch of the second pair of switches includes a first electrode connected to the first input terminal and a second electrode connected to a first electrode of the second photoelectric conversion device, and
wherein respective second electrodes of the first photoelectric conversion device and the second photoelectric conversion device are connected to a cathode voltage.

8. The pixel circuit according to claim 7, wherein body terminals of the first pair of switches and body terminals of the second pair of switches are connected to a predetermined terminal voltage.

9. The pixel circuit according to claim 8, wherein the predetermined terminal voltage is equal to the common reference voltage.

10. A pixel circuit, comprising:
a zero-biased multiplexer;
an amplifier including a first input terminal connected to the zero-biased multiplexer, and an output terminal;
a capacitor disposed between the first input terminal and the output terminal;
a reset switch network disposed between the first input terminal and the output terminal in parallel with the capacitor, the reset switch network including a first reset transistor with a first body terminal connected to a common reference voltage, a second reset transistor, and a third reset transistor; and
a plurality of pixels arranged in an array, a first pixel of the plurality of pixels including a first photoelectric conversion device that is connected to the zero-biased multiplexer, and a second pixel of the plurality of pixels including a second photoelectric conversion device that is connected to the zero-biased multiplexer, wherein
the first reset transistor and the third reset transistor are connected in series between the first input terminal and the output terminal, and
one of a source terminal or a drain terminal of the second reset transistor is connected to a node between the first reset transistor and the third reset transistor.

11. The pixel circuit according to claim 10, wherein the other of the source terminal or the drain terminal of the second reset transistor is connected to the common reference voltage.

12. The pixel circuit according to claim 7, wherein the amplifier includes a second input terminal configured to receive a predetermined terminal voltage.

13. The pixel circuit according to claim 12, wherein the predetermined terminal voltage is equal to the common reference voltage.

14. A pixel circuit, comprising:
a zero-biased multiplexer;
an amplifier including a first input terminal connected to the zero-biased multiplexer, and an output terminal;
a capacitor disposed between the first input terminal and the output terminal;
a reset switch network disposed between the first input terminal and the output terminal in parallel with the capacitor, the reset switch network including a first reset transistor with a first body terminal connected to a common reference voltage, a second reset transistor, and a third reset transistor; and
a plurality of pixels arranged in an array, a first pixel of the plurality of pixels including a first photoelectric conversion device that is connected to the zero-biased multiplexer, and a second pixel of the plurality of pixels including a second photoelectric conversion device that is connected to the zero-biased multiplexer, wherein
during a reset state of the pixel circuit, the first reset transistor is in a closed state, the second reset transistor is in an open state, and the third reset transistor is in the closed state, and
during an integration state of the first photoelectric conversion device, the first reset transistor is in the open state, the second reset transistor is in the closed state, and the third reset transistor is in the open state.

15. The pixel circuit according to claim 7, wherein the first photoelectric conversion device and the second photoelectric conversion device each receives a charge from an incident light, and the zero-biased multiplexer is configured to output respective signals indicative of respective charges that are received to the amplifier.

16. The pixel circuit according to claim 7, wherein the first reset transistor, the second reset transistor, and the third reset transistor are one of NMOS transistors or PMOS transistors, and wherein the zero-biased multiplexer includes a plurality of switches, each of the plurality of switches is one of a NMOS transistor or a PMOS transistor.

* * * * *